United States Patent [19]

Oppelt et al.

[11] Patent Number: 4,945,321
[45] Date of Patent: Jul. 31, 1990

[54] π/2 POWER DIVIDER

[75] Inventors: Ralph Oppelt, Weiher; Markus Vester, Erlangen, both of Fed. Rep. of Germany

[73] Assignee: Siemens Aktiengesellschaft, Berlin and Munich, Fed. Rep. of Germany

[21] Appl. No.: 333,287

[22] Filed: Apr. 5, 1989

[30] Foreign Application Priority Data

Apr. 11, 1988 [DE] Fed. Rep. of Germany ....... 3811986

[51] Int. Cl.$^5$ .............................................. H01P 5/16
[52] U.S. Cl. .................................... 333/119; 333/123; 333/131; 333/170
[58] Field of Search .............................. 333/117–119, 333/123–125, 127, 131, 170

[56] References Cited

U.S. PATENT DOCUMENTS

| | | | |
|---|---|---|---|
| 2,897,456 | 7/1959 | Geppert | 333/127 |
| 3,267,358 | 8/1966 | Anderson . | |
| 3,691,485 | 9/1972 | Beck | 333/123 |
| 3,895,321 | 7/1975 | Seidel . | |
| 4,254,386 | 3/1981 | Nemit et al. . | |
| 4,570,134 | 2/1986 | Woodward | 333/127 X |
| 4,814,730 | 3/1989 | Via et al. | 333/119 |

FOREIGN PATENT DOCUMENTS 0126169 11/1984 European Pat. Off. .
2112037 10/1982 Fed. Rep. of Germany ...... 333/117

OTHER PUBLICATIONS

"Quadrature Detection in the Laboratory Frame," Hoult et al., Magnetic Resonance in Medicine, vol. 1, pp. 339–353 (1984).
"Tauschenbuch der Hoch Frequenztechnik," Fourth Edition, vol. 1, pp. L27–L35 (1986).
"Theorie der Zwei-Phasen-Netzwerke," Wunsch, Nachrichtentechnik, vol. 5, pp. 200–205 (1957).
"Einige grundsaetzliche Betractungen zu Breitband-Uebertragern", Hilberg, NTZ, vol. 9, pp. 527–538 (1966).

*Primary Examiner*—Paul Gensler
*Attorney, Agent, or Firm*—Hill, Van Santen, Steadman & Simpson

[57] ABSTRACT

In a π/2 power divider, particularly a π/2 hybrid for the radio-frequency antenna of a nuclear magnetic resonance tomography apparatus, a decoupling circuit having unbalanced-to-ground line transformers is provided. Each branch thereof contains an all pass network consisting unbalanced-to-ground line transformers at the output. A broadband π/2 hybrid is obtained particularly with a broadband 3 dB/180° hybrid as the decoupling circuit.

12 Claims, 2 Drawing Sheets

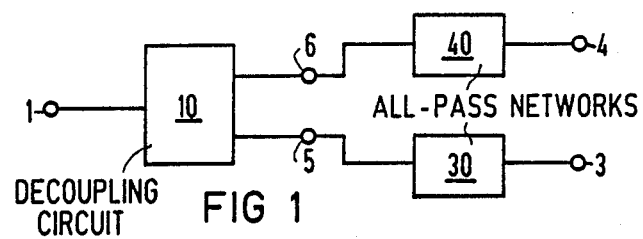
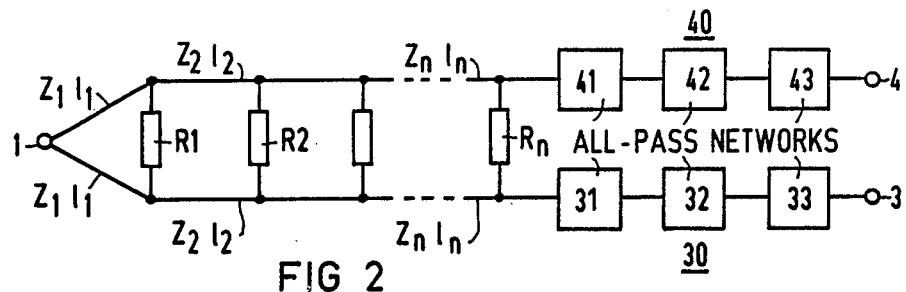
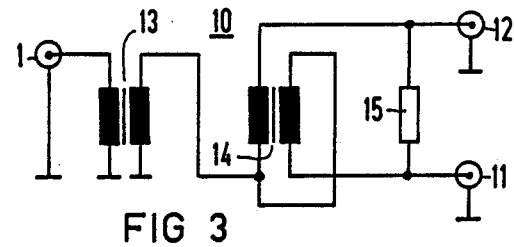
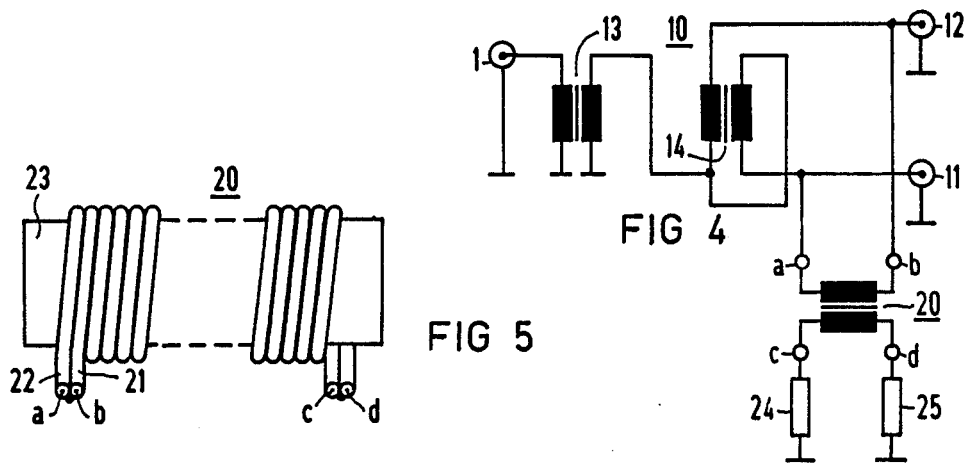
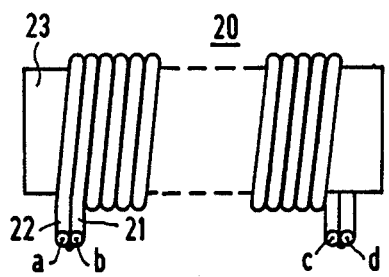

π/2 POWER DIVIDER

BACKGROUND OF THE INVENTION

1. Field of the Invention

The invention is directed to a π/2 power divider that divides an input signal onto two signal paths with identical amplitude and 90° phase shift that can be preferably employed for the circularly polarized radio-frequency antenna of a nuclear magnetic resonance tomograph.

2. Description of the Prior Art

Devices for producing tomograms of an examination subject, preferably a human body, using the phenomenon of nuclear magnetic resonance are known. These so-called NMR tomography devices contain a fundamental field magnet that aligns the nuclear spins in the human body, gradient coils that generate a spatially different magnetic field, and contain radio-frequency coils for exciting the nuclear spins and for the reception of the signals emitted by the excited nuclear spins. Given utilization of such a radio-frequency excitation and measuring coil, the inductance of the coil is interconnected with a variable capacitor to form an LC resonant circuit, whereby the capacitor arrangement is then tuned according to the desired frequency. The feeder for the coil also contains a variable coupling capacitor for coupling the resonator to a radio-frequency generator, which is preferably an oscillator having a following transmission amplifier.

In the state of equilibrium, the magnetization of the nuclear spins is aligned parallel to the external magnetic field. In order to obtain a useable signal, the magnetization must be turned by 90°. The precession of the nuclear spins after the 90° pulse causes the induction of a signal in a wire loop, known as the free induction decay (FID). Since the nuclear spins precess with a mechanical precession frequency in the magehertz range, they generate an alternating electromagnetic field in the coil. The received radio-frequency signal is supplied to a detector via a decoupling circuit. A directional coupler or a switch that can be used as a transmission and reception diplexer for the supplied and received power can be used as the decoupling circuit. The magnetic and electrical frequency fields cause a radio-frequency absorption in the conductive body tissue of the patient. This results in a reduction of the resonant quality Q of the radio-frequency coil. Further, the electrical properties of body tissue cause a reduction of the resonant frequency when the patient is introduced into the coil. Both effects are thus patient-dependent and must be corrected before every exposure by "tuning and matching" the radio-frequency coil.

For operating radio-frequency coils, particularly circularly polarized antennas, 3 dB/90° hybrids are utilized as transmission and reception diplexer. Given an ideally matched antenna, that signal that the transmitter supplies into port 1 of the directional coupler is divided to the ports 3 and 4 with equal powers; these signals, however, are shifted by 90° in phase relative to one another. No radio-frequency power emerges at the receiver port 2 since the ports 1 and 2 as well as 3 and 4 are decoupled from one another. In the reception case, the reception signal arising at the port 4 again leads the signal arising at the port 3 by 90°. The two signals thus add in-phase at the receiver port 1 (Taschenbuch der Hochfrequenztechnik, 4th ed. Vol. 1, 1986, pages L27-L35).

The 3 dB/90° hybrids can be constructed in line technology or with discrete components and can also be constructed as mixed versions. In these embodiments, the bandwidth employable for the nuclear magnetic resonance tomography is extremely narrow and, for example, is not significantly more than 2%. At low frequencies of, for example, about 10 MHz, broadband directional couplers consisting of coupled lines would have an unfavorably long line length. When, for example, various types of atoms are to be investigated in a nuclear magnetic resonance tomograph, for example, hydrogen, phosphorous or sodium, i.e., when an examination to be undertaken at different resonant frequencies, then an associated 3 dB/90° hybrid is required for each of these frequencies. Interchanging or switching among several such 3 dB/90° hybrids is relatively complex and time-consuming.

Two-phase networks having the property of producing two output voltages shifted by a constant angle relative to one another at two pairs of output posts via a finite frequency interval are also known. Such networks serve the purpose of generating two output signals that exhibit the same level in the frequency range used and exhibit a phase difference, for example 90°. Each of the two, split signal paths contains a quadripole circuit that has a portion of the transmission factor that is independent of the frequency, i.e., what is referred to as an all-pass. In general, each signal path will contain a chain of a plurality of all-passes of the first or second order (Nachrichtentechnik, No. 5, 1957, pages 200–205).

It is also known that a radio-frequency differential transformer can also be constructed with line transformers (NTZ, 1966, No. 9, pages 527–538).

A π/2 hybrid is also known that can be used for driving the circularly polarized antenna of a nuclear magnetic resonance tomograph with an operating frequency of about 2.5 through 8.2 MHz. It contains a series circuit of two transformers having different numbers of turns in their primary and secondary windings. A transmitter and a pre-amplifier are connected to those primaries. The transformers are provided with divided secondary windings. All-pass elements having different dimensioning are connected to these secondaries, these all-pass elements having to be driven anti-phase (Magnetic Resonance in Medicine pages 339–353 (1984)).

SUMMARY OF THE INVENTION

It is an object of the present invention to provide a 3 dB/90° hybrid having a large bandwidth that, when used in an NMR apparatus, frequent switching or interchanging of a number of different 3 dB/90° hybrids is not necessary.

The invention is based on the perception that a circularly polarized operation of the nuclear magnetic resonance tomograph is possible at different resonant frequencies, i.e., for different atoms, when a broadband decoupling circuit is used together with a 90° two-phase network. Therefore, in accordance with the principles of the present invention, a decoupling circuit containing line transformers is combined with all-pass networks and impedance transformers that are composed of line transformers. When only a transmission mode is required, the decoupling circuit can be composed of a differential transformer or a Wilkinson power divider. For transmission and reception mode, the decoupling circuit can preferably be composed of a broadband 3 dB/180° hybrid. By combining the broadband 3 dB/180° as a power divider with all-pass networks in two signal paths, a broadband 3dB/90° directional coupler is obtained that can be employed as a transmission and reception diplexer for circularly polarized radio-frequency antennas in a broad frequency range, particularly from at least 15 through at least 100 MHz.

In an embodiment of a three-port decoupling circuit, for example a Wilkinson power divider, the broadband $\pi/2$ power divider can, for example, also be employed in radar technology for feeding transmission antenna or can be employed for driving mixers as well as, for example, bridge amplifiers.

DESCRIPTION OF THE DRAWINGS

FIG. 1 schematically shows a $\pi/2$ power divider of the invention in the form of a three-port decoupling circuit.

FIG. 2 schematically shows a three-port wilkinson power divider.

FIG. 3 shows a differential transformer having a preceding impedance transformer provided as a decoupling circuit.

FIGS. 4 and 5 each show a specific embodiment of a differential transformer as a decoupling circuit.

DESCRIPTION OF THE PREFERRED EMBODIMENTS

Figure 6:
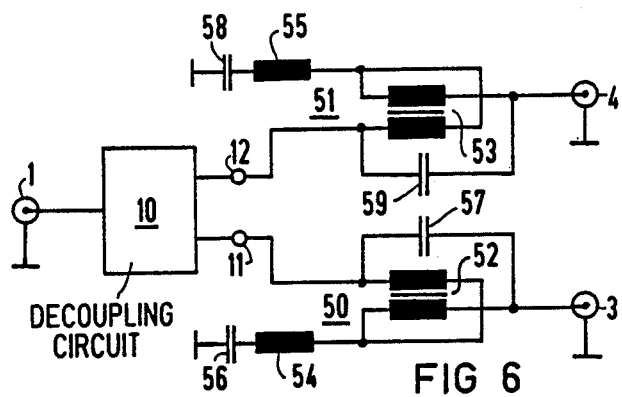
FIG. 6 shows a specific embodiment of an all-pass network.

In the embodiment of a $\pi/2$ power divider of FIG. 1, a three-port network is provided as a decoupling circuit 10, the port 1 of this three-port being connected to a transmitter that is not shown in the drawing. The decoupling circuit 10 branches a transmission signal at the port 1, so that two signals of identical amplitude appear at the ports 5 and 6, and these two signals are decoupled from one another. The two branched signal paths each contain an all-pass network 30 or 40, so that the signals appear at the ports 3 and 4 with a 90° phase difference. This embodiment of the $\pi/2$ power divider is suitable, for example, for a transmission power of 1 kW in CW mode or 15 kW pulsed power. A maximum amplitude difference of only about ±1% and a phase error of at most ±1% as well as a through attenuation per signal path of at most 3.01+.3 dB is obtained with line transformers both in the decoupling circuit 10, as well as in the all-pass filter chains 30 and 40 a frequency range of, for example, 15 through 86 MHz in a 50 ohm system.

For example, the all-pass filter chains 30 and 40 can each form a network having at least one all-pass of the first degree, preferably a plurality of all-passes of the first degree per branch, whereby two all-passes of the first degree can be combined to form one all-pass of the second degree. Such all-passes, for example, can be respectively composed of a lattice section, known as X-elements, but can be preferably composed of bridged T-elements.

In the embodiment of $\pi/2$ power divider of FIG. 2 a Wilkinson power divider is provided as the decoupling circuit 10, the input 1 thereof to be connected to a transmitter (not shown). A shunt resistor R1 is connected in parallel with the input 1 via a respective line having a characteristic impedance $Z_1$ and a length $l_1$. In the next stage, a shunt resistor R2 is connected in parallel in the same fashion via a respective line having a characteristic impedance $Z_2$ and a length $l_2$. In this embodiment of the decoupling circuit 10, the Wilkinson power divider preferably contains at least one stage, for example, five stages, the last stage of which is connected via a line having a characteristic impedance $z_n$ and a length $l_n$. The shunt resistors R1 through $R_n$ serve the purpose of decoupling the two ports 3 and 4. The opened signal paths each contain a chain of, for example, three all-passes of the first degree, that are referenced 31 through 33 and 41 through 43, and which, for example can be composed of bridged T-elements. Signals having identical amplitude and a 90° phase shift appear at the outputs 3 and 4.

The embodiment of FIG. 3 shows a decoupling circuit 10 that is composed of a differential transformer having a preceding impedance transformer, the transformers being constructed as line transformers. A transmitter (not shown) is connected to the port 1 and the ports 11 and 12 are each connected to an all-pass filter chain. The line transformer 13 for impedance transformation that follows the port 1 has a transformation ratio of approximately $\sqrt{2}:1$, for example 3:2. The differential transformer 14 having the transformation ratio of 1:1, which is likewise constructed as a line transformer, follows the line transformer 13. This transformer is connected to both ports 11 and 12. A resistor 15 having a size 2Z (i.e., twice the characteristic impedance Z) is arranged between these ports. The following scattering matrix derives in this embodiment of the decoupling circuit 10:

$$S = \frac{1}{\sqrt{2}} \cdot \begin{bmatrix} 0 & 1 & 1 \\ 1 & 0 & 0 \\ 1 & 0 & 0 \end{bmatrix}$$

whereby the first port in the matrix formulation in FIG. 3 is referenced 1 the second port is referenced 11 and the third port is referenced 12.

In the embodiment of a decoupling circuit 10 according to FIG. 4 comprising the port 1 and the ports 11 and 12 as well as the line transformers 13 and 14, an auxiliary transformer 20 is connected to the ports 11 and 12, both ends of the secondary winding in said auxiliary transformer 20 being respectively applied to ground via a termination or load and 24, having the characteristic impedance Z. As a result the balanced-to-ground resistor having the impedance 2Z (15 in FIG. 3) can be replaced by two unbalanced-to-ground terminates 24 and 25, each of which has the impedance Z.

In the embodiment of FIG. 5, the auxiliary transformer 20 can be preferably composed of two coaxial lines 21 and 22 having an impedance Z that are arranged parallel to one another and are wound on a common core 23. The ends a and b of the inner conductors of the coaxial lines 21 and 22 are then applied to the ports 11 and 12 of the decoupling circuit 10, and the ends c and d are applied to the terminations 24 and 25. The jackets or sheaths of the coaxial lines 21 and 22 are connected to one another at both ends.

In the embodiment of a $\pi/2$ power divider according to FIG. 6, the ports 11 and 12 of the decoupling circuit 10 are each followed by an all-pass network of the second order 50 or 51, each of these containing a line transformer 52 or 53, an inductance 54 or 55, as well as two capacitors 56 and 57 or 58 and 59. In this embodiment, in each branch two all-passes of the first degree are combined to form one all-pass of the second degree. Compared to all-passes of the first degree, all-passes of the second degree have the advantage that non-ideal properties of components, for example, inadequate coupling of coupled coils, injurious series inductances of capacitors and injurious parallel capacitances of coils, can be compensated to a degree. Further, fewer components are required in this embodiment, resulting in lower through losses.

Figure 7:
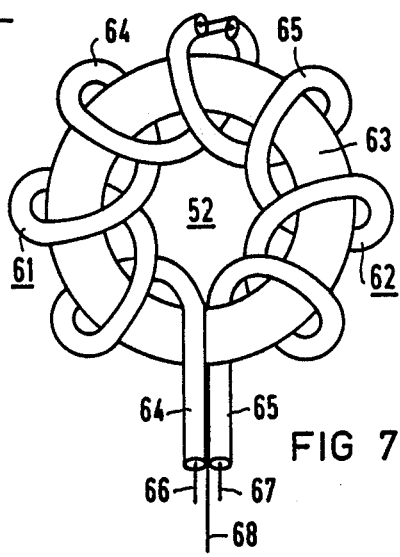
FIG. 7 illustrates the coupled coil of an all-pass network as transmission line transformer.

According to FIG. 7, the all-pass filter 50 can contain a line transformer 52 having a symmetrical structure wherein two coaxial conductors 61 and 62 are wound, for example, on a common core 63 shaped as a toroid. The jackets of the two coaxial conductors are referenced 64 and 65 and the inner conductors are referenced 66 and 67. At the upper ends of these coaxial conductors 61 and 62, the inner conductor 66 of the one coaxial conductor 61 is connected to the outer jacket 65 of the other coaxial conductor 62 and vice versa. According to FIG. 6, the capacitor 57 then lies between the inner conductors 66 and 67 of the lower end, and the two jackets 64 and 65 that are electrically connected to one another are connected to the inductance 54. The jackets 64 and 65 of the coaxial conductors 61 and 62 form a common terminal 68. A completely structure-symmetrical line transformer is obtained by the crossing at the upper ends of the coaxial conductors 61 and 62.

Figure 8:
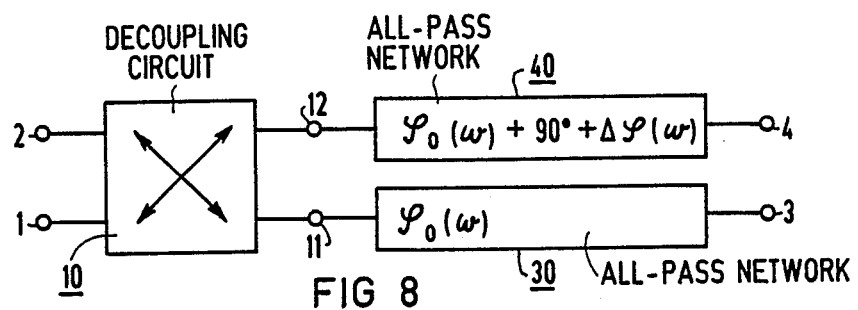
FIG. 8 shows a broadband 3 dB/180° hybrid as a decoupling circuit.

In a preferred embodiment of the $\pi/2$ hybrid according to FIG. 8, a broadband 3 dB/180° hybrid is provided as decoupling circuit 10; a transmitter can be connected to its port 1 and a receiver can be connected to its port 2. The port 11 is followed by an all-pass cascaded circuit that yields an output signal having the phase angle $\phi_0(\omega)$ at the port 3. The port 12 is followed by another all-pass cascaded circuit that yields an output signal having the phase angle $\phi_0(\omega)+90°+\Delta\phi(\omega)$ at the port 4. In this embodiment of the $\pi/2$ hybrid, a broadband transmission and reception diplexer is obtained that can preferably be employed for operating a circularly polarized antenna of a nuclear magnetic resonance tomograph. In this embodiment, a scattering matrix $$S = \frac{e^{j\phi_0(\omega)}}{\sqrt{2}} \cdot \begin{bmatrix} 0 & 0 & 1 & j \cdot \delta \\ 0 & 0 & -1 & j\delta \\ 1 & -1 & 0 & 0 \\ j\delta & j\delta & 0 & 0 \end{bmatrix}$$

is obtained. In the ideal case, the residual phase error $\Delta\phi(\omega)$ disappears, i.e, $$\delta = e^{j\Delta\phi(\omega)} \to 1$$

Figure 9:
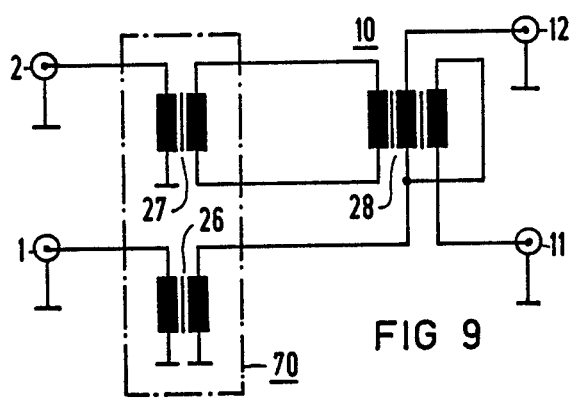
FIG. 9 shows a broadband 3 dB/180° hybrid as a decoupling circuit.

According to FIG. 9, a differential transformer 28 fashioned as a line transformer can be provided as the decoupling circuit 10, this differential transformer 28 forming a broadband 3 dB/180° hybrid together with two further line transformers 26 and 27. A transmitter is again to be connected to port 1 and a receiver is again to be connected to the input 2. The ports 11 and 12 are each connected to an all-pass filter chain. The port 1 is connected to the line transformer 26 and the port 2 is connected to the line transformer 27. These input transformers each have a transformation ratio of at least approximately $\sqrt{2}:1$, for example 3:2, and thereby act as an impedance transformer, designated 70. The differential transformer 28 has a transformation ratio 1:1:1. The two secondary windings (not referenced in greater detail) are each connected to one of the ports 11 and 12. In this embodiment of the 3 dB/180° hybrid 10, a scattering matrix $$S = \frac{1}{\sqrt{2}} \cdot \begin{bmatrix} 0 & 0 & 1 & 1 \\ 0 & 0 & -1 & 1 \\ 1 & -1 & 0 & 0 \\ 1 & 1 & 0 & 0 \end{bmatrix}$$

is obtained.

In this embodiment, all transformers are fashioned as line transformers, a great bandwidth being obtained as a result.

Although modifications and changes may be suggested by those skilled in the art, it is the intention of the inventors to embody within the patent warranted hereon all changes and modifications as reasonably and properly come within the scope of their contribution to the art.

We claim as our invention:

1. A $\pi/2$ power divider for dividing an input signal in two signal paths with the same amplitude and phase quadrature, said divider comprising:
   a decoupling circuit having an input and two outputs and containing at least one line transformer; and
   two unbalanced to ground all-pass networks respectively connected to said outputs of said decoupling circuit, each all-pass network consisting of a line transformer.

2. A $\pi/2$ power divider as claimed in claim 1, wherein said decoupling circuit means is a differential transformer.

3. A $\pi/2$ power divider as claimed in claim 2, further comprising:
   an impedance transformer having a transformation ratio of at least approximately $\sqrt{2}:1$ connected preceding said differential transformer, and said differential transformer having a transformation ratio of 1:1 and having a characteristic impedance Z and having outputs; and
   a resistor connected across said outputs of said differential transformer and having an impedance 2Z.

4. A $\pi/2$ power divider as claimed in claim 2, further comprising:
   an impedance transformer connected preceding said differential transformer and having a transformation ratio of at least approximately $\sqrt{2}:1$, and said differential transformer having a transformation ratio of 1:1 and having a characteristic impedance Z and having outputs;
   an auxiliary transformer connected across said outputs of said differential transformer and having outputs; and
   two loads respectively connected to the outputs of said auxiliary transformer and each having an impedance Z.

5. A $\pi/2$ power divider as claimed in claim 4, wherein each load consists of a coaxial unbalanced-to-ground termination.

6. A $\pi/2$ power divider as claimed in claim 4, wherein said auxiliary transformer consists of a core and two coaxial lines each having a impedance Z wound in parallel on said core.

7. A $\pi/2$ power divider as claimed in claim 1, wherein each all pass network contains at least one all pass filter of the first or second degree, and each all pass filter containing a line transformer.

8. A $\pi/2$ power divider as claimed in claim 7, wherein each line transformer in each all pass filter has a symmetrical structure.

9. A $\pi/2$ power divider as claimed in claim 8, wherein each said line transformer comprises:
   a core; and
   two coaxial lines of the same length symmetrically wound on said core, each coaxial line having an outer sheath surrounding a conductor and having a first free end, said first free ends of said lines forming a common terminal for said line transformer, and each having opposite second ends cross-connected to each other with the sheath at one second free end of one of said lines connected to the conductor at the second free end of the other coaxial line and vise versa.

10. A four gate $\pi/2$ hybrid network with a scattering matrix $$S = \frac{e^{j\phi_0(\omega)}}{2} \cdot \begin{bmatrix} 0 & 0 & 1 & j\delta \\ 0 & 0 & -1 & j\delta \\ 1 & -1 & 0 & 0 \\ j\delta & j\delta & 0 & 0 \end{bmatrix}$$

with $\phi_0(\omega)$ bieng an input signal phase, $\Delta\phi(\omega)$ being a phase shift in the network, and $\delta = e^{j\Delta\phi(\omega)}$, and comprising:
   a broadband 3 db/180° hybrid as a decoupling circuit with a transmitting gate, a receiving gate, and first and second output gates, said output gates containing a differential transformer in the form of a line transformer;
   a first impedance transformer in the form of a line transformer connected to said transmitting gate;
   a second impedance transformer in the form a line transformer connected to said receiving gate;
   a first unbalanced to ground all-pass cascaded network formed by line transformers and being connected to said first output gate and generating a phase response $\pi_0(\omega)$; and
   a second unbalanced to ground all-pass cascaded network connected to said second output gate and generating a phase response $\pi_0(\omega) + 90° + \Delta\phi(\omega)$.

11. A hybrid network as claimed in claim 10 wherein said impedance transformers have a transmission ratio of $\sqrt{2:1}$.

12. A hybrid network as claimed in claim 10, wherein said impedance transformers have a transmission ratio of 3:2.

* * * * *